United States Patent [19]

Moriguchi et al.

[11] Patent Number: 4,477,820

[45] Date of Patent: Oct. 16, 1984

[54] METHOD OF DRIVING A THERMAL HEAD

[75] Inventors: Haruhiko Moriguchi; Toshiharu Inui, both of Kanagawa, Japan

[73] Assignee: Fuji Xerox Co., Ltd., Tokyo, Japan

[21] Appl. No.: 440,061

[22] Filed: Nov. 8, 1982

[30] Foreign Application Priority Data

Nov. 6, 1981 [JP] Japan .................... 56-177132

[51] Int. Cl.³ ............................. G01D 15/10
[52] U.S. Cl. .............................. 346/76 PH; 346/1.1; 358/296
[58] Field of Search .......................... 346/76 PH, 1.1; 358/296, 302

[56] References Cited

U.S. PATENT DOCUMENTS 4,141,018 2/1979 Mizuguchi .................. 346/76 PH
4,368,491 1/1983 Saito ........................... 346/76 PH

*Primary Examiner*—E. A. Goldberg
*Assistant Examiner*—Mark Reinhart
*Attorney, Agent, or Firm*—Sughrue, Mion, Zinn, Macpeak & Seas

[57] ABSTRACT

A thermal head driving method in which serial picture data to be recorded on one line is inputted into a shift register which produces parallel picture data corresponding to the input series picture data to drive heating elements of a thermal head by the parallel picture data. The method comprises the steps of inputting serial picture data into the shift register and a distinguishment data element is added in front of the serial picture data. A timing determination of when a predetermined amount of picture data to be simultaneously recorded have been set in the shift register is made on the basis of a timing when the distinguishment data element is outputted from an output terminal through which the serial picture data is outputted. The thermal head is driven while stopping input of a serial picture data into the shift register, at the first-mentioned timing.

5 Claims, 3 Drawing Figures

METHOD OF DRIVING A THERMAL HEAD

BACKGROUND OF THE INVENTION

The present invention relates to a method of driving a thermal head used for thermal recording.

In a thermal recording apparatus, for example, a thermal head in selectively driven to cause a portion of a sheet of thermosensitive paper placed in contact with the thermal head to generate color to record information thereon. Ordinarily, a number of heating elements are aligned in the thermal head. It is not efficient to separately drive these heating elements at different timing, in view of recording speed requirements. Accordingly, in ordinary recording apparatus, a plurality of heating elements are simultaneously driven. To this end in such an apparatus, a serial picture data is inputted to a shift register and then converted therein into parallel picture data in response to which the heating elements are driven. In the case where the heating elements are grouped and to be driven group after group a number times per one line in such an apparatus, however, it is necessary to replace old picture data set in the shift register by new data a corresponding number times for one line.

To this end, a counter has been provided in the conventional apparatus to count every time pieces of picture data corresponding to the number of the heating elements to be driven simultaneously have been inputted to the shift register and produce a signal indicating the completion of setting of data. In response to the set completion indication signal, the transfer of the picture data to the shift register is stopped and then restarted after the driving of the concerned heating elements has been attained. The replacement of picture data in the shift register has been achieved in this manner.

In such a conventional thermal head driving method, however, there is a drawback that as the number of the heating elements to be simultaneously driven increases according to demands for high speed recording, this increases the counter size and accordingly increases the cost of the entire apparatus.

SUMMARY OF INVENTION

An object of the present invention is to provide, in order to eliminate the above-mentioned drawback, a method of driving a thermal head in which it is not necessary to provide any counter for counting the picture data inputted to a shift register even in the case where all the heating elements are grouped into plural blocks and driven block after block.

It is another object of this invention to provide a method of drawing a thermal head that is low in cost yet highly efficient in systems driving plural blocks of elements.

According to the present invention, the setting of data is detected by monitoring the signal status at a data output terminal of the shift register to thereby attain the above-mentioned objects. The principle of this method will be described by referring to the drawing and the description of the preferred embodiment that follows.

DESCRIPTION OF THE PREFERRED EMBODIMENT

Figure 1:
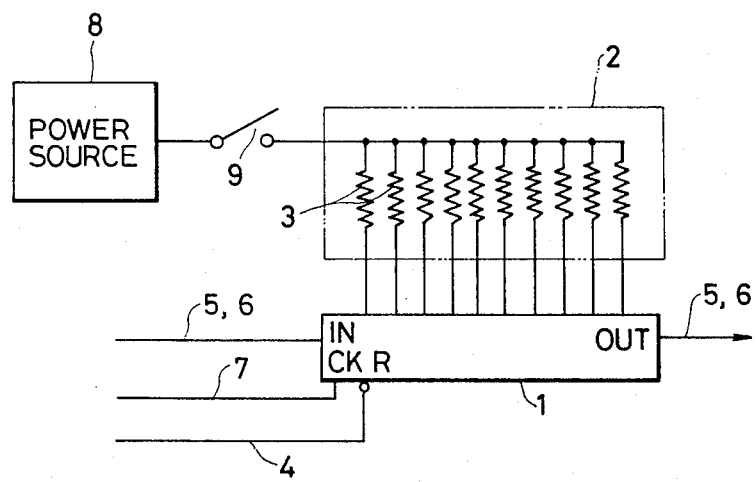
FIG. 1 is a block diagram explaining the principle of operation of a thermosensitive recording apparatus.
Figure 2A:
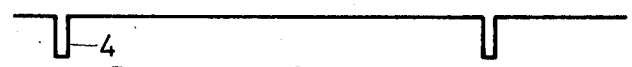
FIG. 2 is a time chart explaining the driving the thermal head according to the invention.

In FIG. 1, a shift register 1 is connected to a plurality of heating elements 3 of a thermal head 2 which are to be simultaneously driven. A data reset signal 4 is applied to a reset terminal R of the shift register 1 in a timing relationship shown in FIG. 2(a) in advance to the transfer of picture data. The shift register 1 is reset in response to the data reset signal 4. Then, slightly after the reset, a dummy bit 5 and a picture data 6 are successively supplied in this order to a data input terminal IN of the shift register 1 (FIG. 2(b)), in accordance with a clock signal 7 supplied to a clock input terminal CK of the shift register 1. The dummy bit 5 and the picture data 6 are shifted in the shift register 1 in response to the clock signal 7 until the dummy bit 5 is outputted from a data output terminal OUT (FIG. 2(c)).

Figure 2B:
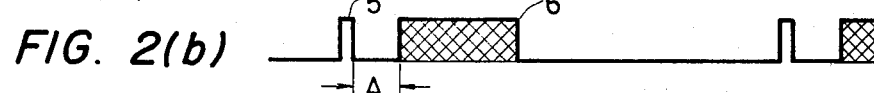
Figure 2C:
Figure 2D:

If the period between the respective times of the input of the dummy bit 5 and the picture data 6 to the data input terminal IN of the shift register 1 is represented by A (FIG. 2(b)), the setting of the picture data 6 is completed at the time after the lapse of period A from the time when the dummy bit 5 has been outputted from the data output terminal OUT. Accordingly, the recording apparatus stops the input of the picture data 6 at this time and connects the heater elements 3 to a power source 8 through a switch 9 so that the thermal head 2 is driven for a predetermined period B (FIG. 2(d)). Thereafter, the contents of the shift register 1 are cleared by the data reset signal 4, so that the same operation discussed above may be repeated to achieve thermosensitive recording on the recording paper.

Figure 3:
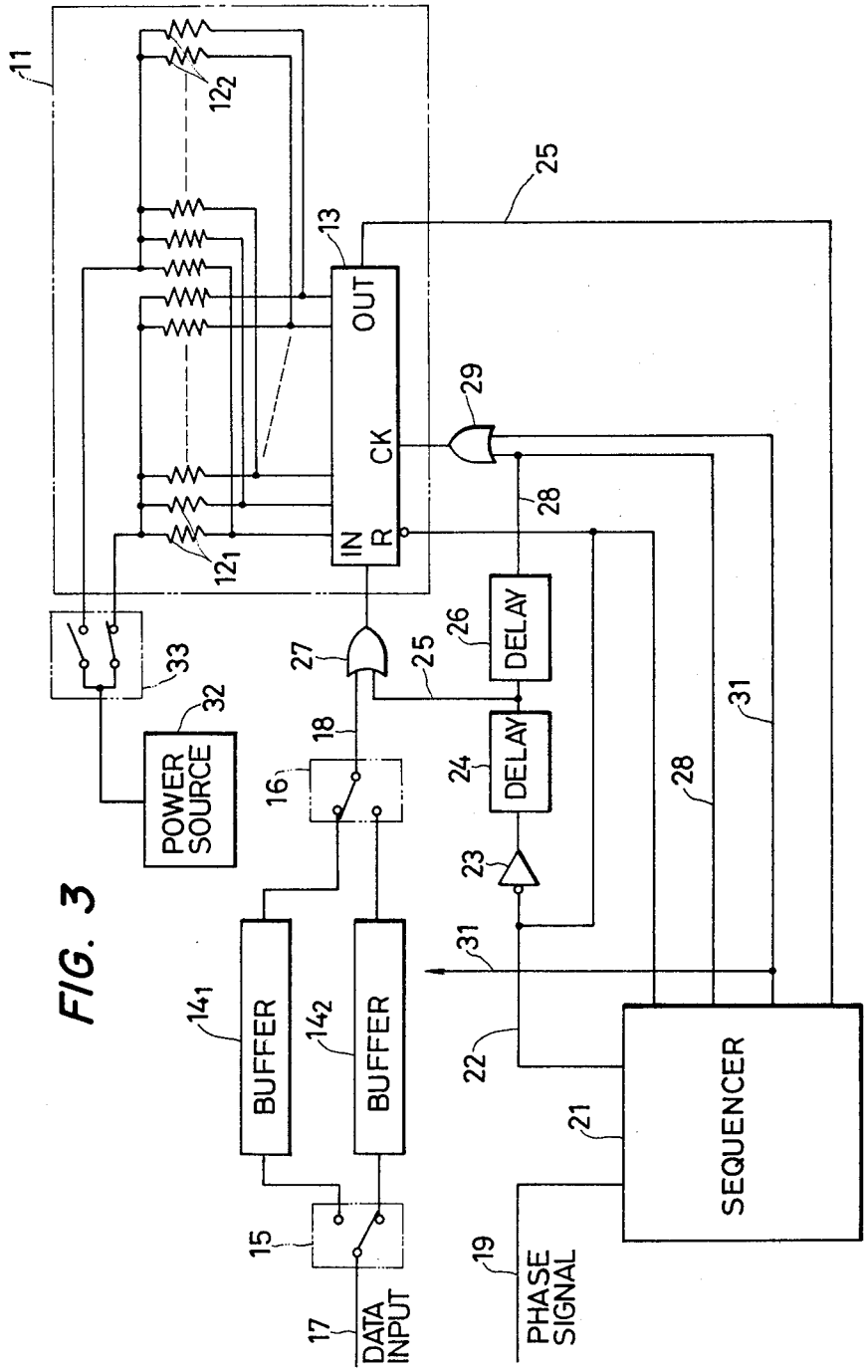
FIG. 3 is a block diagram of a thermosensitive recording apparatus for explaining the present invention.

An embodiment of the present invention will now be particularly described. FIG. 3 shows a recording apparatus comprising a thermal head 11 for attaining recording by recording twice, one portion after another on every line. The thermal head 11 is provided with two blocks of heater elements, and a shift register driver integrated circuit 13. The respective blocks of heater elements $12_1$ and $12_2$ are aligned at an interval of 8 dots/mm along a distance of 216 mm. The shift register driver 13 is an integrated circuit constituted by a shift register having a bit capacity of 864 bits and a switching circuit for driving the heater elements $12_1$ and $12_2$. Such IC's are well known in this technology.

The recording apparatus comprises two one-line buffers $14_1$ and $14_2$ that are arranged such that when picture data 17 for a certain line is being inputted into one of the one-line buffers, picture data 18 for one previous line comes out of the other one-line buffer, by the actuation of the change-over switches 15 and 16 provided at the input side of each of the one-line buffers $14_1$ and $14_2$ and at the output side of the same, respectively.

A sequencer 21 receives a phase signal 19 generated for every line in synchronism with the change-over of the change-over switches 15 and 16 and produces a data reset signal 22 after the lapse of a predetermined time from the reception of the phase signal 19. The data reset signal 22 is supplied to a reset terminal R of the shift register driver IC 13 to clear picture data which has been used for the previous recording. The data reset signal 22 is also applied to a first delay circuit 24 through an inverter 23 and delayed by 0.5 $\mu$sec therein to be formed into a dummy bit 25. The dummy bit 25 is supplied not only to a second delay circuit 26 but to a data input terminal IN of the shift register driven IC 13 through an OR circuit 27.

The second delay circuit 26 delays the dummy bit 25 by a slight time to form a dummy bit input clock signal 28. The dummy bit input clock signal 28 is applied not only to the sequencer 21 but also to a clock input terminal CK of the shift register driver IC 13. In response to the clock signal 28, the dummy bit 25 is inputted to the shift register driver IC 13. The sequencer 21 detects this timing by the dummy bit input clock signal 28 to produce 1 MHz clock signal 31 for actuating the shift register driver IC 13 to start the data shifting sequence.

The clock signal 31 is also applied to the first and second one-line buffers 14₁ and 14₂. When in a status where the change-over switch 16 is selecting the first one-line buffer 14₁ as shown in FIG. 2, the first one-line buffer 14₁ outputs the picture data 18. The picture data 18 is applied to the data input terminal IN of the shift register driver IC 13 through the OR circuit 27, and inputted to and shifted in the shift register driver IC 13 in synchronism with the clock signal 31 applied to the clock input terminal CK through the OR circuit 29.

In this manner, picture data 18 is successively inputted into the shift register driver IC 13 and a dummy bit 25 comes out of the serial out terminal OUT, which is connected to the final stage of the shift register, after the lapse of 0.864 μsec from the time when the dummy bit 25 has been inputted. The thus outputted dummy bit 25 is applied to the sequencer 21. In the sequencer 21, a period of time is set from the time when the dummy bit 25 has been inputted into the shift register driver IC 13 to the time when the picture data 18 has been inputted into the shift register driver IC 13.

For example, if the above-mentioned period of time is set to be 4 μsec, the sequencer 21 stops the sending-out of the clock signal 31 after the lapse of 4 μsec from the time when the dummy bit 25 has been outputted from the shift register driver IC 13. Upon the stoppage of the clock signal 31, the transfer of the picture data 18 from the first one-line buffer 14₁ is stopped and the shifting data in the shift register driver IC 13 is also stopped. At this time, 864 bits of picture data have been inputted to the shift register driver IC 13. When a power source 32 is connected to the 864 number of heating elements 12₁ through one of the contacts of a switch 33 which is now actuated as shown in FIG. 3, the heating elements 12₁ are selected allowed to pass a current to generate heat, so that the thermosensitive recording is attained on one-half of one line.

Then, the sequencer 21 produces a data reset signal at a predetermined time to clear the data in the shift register driver IC 13.

Similar to the above-mentioned manner, then, picture data for the remainder half of the one line is inputted into the shift register driver IC 13. The switch 33 is actuated at this time, to close the other contact to connect the power source 32 to the heater elements 12₂, thereby accomplishing the thermosensitive recording on the remainder half of the one line.

Upon the completion of thermosensitive recording on one line, the change-over switches 15 and 16 are actuated to output from the second one-line buffer 14₂ a picture data. A phase signal 19 is supplied to the sequencer 21 so that the series of operations as mentioned above are restarted.

Thus, according to the present invention, since the picture data inputted into a shift register is controlled without using a counter, there are advantages that the components or parts constituting the apparatus may be reduced in number and the apparatus may be accordingly improved by its reliability.

Although a dummy bit is formed by delaying a data reset signal ordinarily used in a shift register in the embodiment mentioned above, the present invention is not limited to the method. Further, although a shift register driver IC is used in the embodiment, it is possible to replace the shift register driver IC by a shift register and a driver circuit which are separately provided as individual devices.

What is claimed is:

1. A method of driving a thermal head in which serial picture data to be recorded on one line is inputted to a shift register which produces parallel picture data corresponding to said input series picture data to drive heating elements of a thermal head by said parallel picture data, said method comprising the steps of; inputting serial picture data into said shift register together with a distinguishment data element added in front of said serial picture data, determining a time frame when a predetermined amount of picture data to be simultaneously recorded have been inputted to said shift register on the basis of timing when said distinguishment data is produced from an output terminal through which said serial picture data is outputted and, driving said thermal head while inhibiting the further input of serial picture data into said shift register during said time frame.

2. The method of claim 1 further comprising the steps of clearing the contents of said shift register following the driving of said thermal head and, inputting new serial picture data together with a distinguishment data element into said shift register.

3. The method of claim 1 further comprising the steps of inputting serial picture data into a plurality of one line buffer memories and gating the data flow from said buffer memories into said shift register, wherein when series picture data is inputted into said shift register from one of said buffer memories, new series picture data is inputted into the other of said buffer memories.

4. The method of claim 3, wherein said distinguishment data element is added to said series picture data as it is transferred from a buffer memory to said shift register.

5. The method of claim 4 further comprising the steps of determining the input of said distinguishment data element into shift register and actuating said shift register to start data shifting.

* * * * *